United States Patent
Dediu et al.

(10) Patent No.: US 6,325,914 B1
(45) Date of Patent: Dec. 4, 2001

(54) METHOD AND DEVICE FOR TRANSFERRING SPIN-POLARIZED CHARGE CARRIERS

(75) Inventors: Valentin Dediu; Carlo Taliani, both of Bologna (IT)

(73) Assignee: Consiglio Nazionale Delle Richerche, Rome (IT)

( * ) Notice: Subject to any disclaimer, the term of this patent is extended or adjusted under 35 U.S.C. 154(b) by 0 days.

(21) Appl. No.: 09/619,786

(22) Filed: Jul. 20, 2000

(30) Foreign Application Priority Data

Mar. 22, 2000 (IT) .............................. MI20A0603

(51) Int. Cl.⁷ ...................................... G11B 5/39
(52) U.S. Cl. ........................... 205/688; 204/164; 204/155
(58) Field of Search ............................ 205/688; 204/155, 204/164

(56) References Cited

U.S. PATENT DOCUMENTS 4,224,525 * 9/1980 Phillips et al. ........................ 204/155
5,043,693 8/1991 Edelstein .

FOREIGN PATENT DOCUMENTS 0 272 178 6/1988 (EP) .
98 12758 3/1998 (WO) .

OTHER PUBLICATIONS

Patent abstractS of Japan vol. 1998, No. 13, Nov. 30, 1998—& JP 10 206513 A (Toyota Res; Dev Lab), Aug. 7, 1998 paragraphs '0012!'0024!, '0032!.

De Teresa J et al: "Manganite-based magnetic tunnel junctions" Materials physics issues and applications of magnetic oxides, Strasbourg, Jun. 1999, J. Magnetism and materials, Mar. 2000, vol. 211, No. 1–3, pp. 160–166 XP004202847 ISS: 0304–8853 the whole document.

Dyakonov V et al: "Evidence for triplet interchain polaron pairs and their transformations in polyphenylenevinylene" Physical review B, Aug. 97, vol. 56, No. 7, pp. 3852–3862, XP002153989 ISSN: 0163–1829 p. 3852 p. 3853.

* cited by examiner

Primary Examiner—Arun S. Phasge
(74) Attorney, Agent, or Firm—Rockey, Milnamow & Katz, Ltd.

(57) ABSTRACT

A method for transferring spin-polarized charge carriers, comprising the steps of:
  a) injection of spin-polarized charge carriers in an organic material and
  b) transport of the spin-polarized charge carriers through the organic material.

The invention also relates to a device for the spin-polarized transfer of charge carriers, comprising:
  a) a medium suitable for the transport of spin-polarized charge carriers, and
  b) apparatus for injecting spin-polarized charge carriers into the medium suitable for the transport of spin-polarized charge carriers, the medium suitable for the transport of spin-polarized charge carriers comprising an organic material.

22 Claims, 5 Drawing Sheets

METHOD AND DEVICE FOR TRANSFERRING SPIN-POLARIZED CHARGE CARRIERS

BACKGROUND OF THE INVENTION

The present invention belongs to the field of organic electronics and magnetoelectronics and relates to a method and a device for injecting and transferring spin-polarized charge carriers, particularly in organic semiconductors.

Control of the spin polarization (SP) of charge carriers injected into metallic, semiconducting or insulating materials allows to introduce and control a new degree of freedom in different electronic devices. A new type of electronics, known as magnetoelectronics, has been developed on this basis and has a decisive role in the technology of computers, multimedia and communications.

Many types of processors and memory elements for computers are in fact based on the property of the devices to change their electric resistance according to the orientation of the spins of the charge carriers, thus allowing to read the magnetic information by means of a simple measurement of resistance [1].

The discoveries of materials which exhibit giant magnetoresistance (magnetic metallic multilayers, GMR) [2] and colossal magnetoresistance (perovskitic manganites, CMR) [3] lead to an essential improvement in this field due to the strong electrical signal that can be obtained in these materials even in low magnetic fields.

GMR materials, discovered in 1988, were used in the computer industry already in 1994.

Several electronic devices based on CMR materials have been proposed during the 1990s. These devices comprise both memory elements and various types of active elements, such as magnetic processors, magnetic transistors and hybrid transistors with inserted superconducting materials.

On the one hand, organic electronics has undergone a great development starting from the 1990s. Essentially, this relates to light-emitting diodes (LED) and FET transistors. At present, there are no devices in which the organic material would be used with an active element in magnetoelectronics. The use of organic materials in electronics has advantages, the most important being:

1. The possibility to deposit organic films with low-cost methods even on a very large deposition area. Differently from semiconducting films, which require ultrahigh-vacuum techniques, deposition of organic materials can occur even in ambient atmosphere.

2. The low cost of said organic materials.

3. The possibility to create flexible devices, for example various color displays.

4. The possibility to vary the colors in optical devices, so as to cover the entire visible spectrum.

5. The possibility to reversibly deposit organic films, which can be subsequently removed and replaced with other materials.

Accordingly, the development and efficiency improvement of organic electronic devices are of primary importance.

In order to produce magnetoelectronic devices it is necessary to have the possibility to create inside the active element of the device spin-polarized charge carriers. There exist various ways for spin-polarized charge carriers creation. For example, by illuminating the properly doped GaAs or a similar semiconductor with circularly-polarized light one excites triplet excitons with their spins aligned along the external magnetic field [4]. It is also known the use spin filters, i.e., devices across which can pass only charge carriers having a certain spin polarization [5]. However, such methods are complicated, expensive, and require the presence of magnetic field.

A third known method is the use of a magnetic material with intrinsic spin polarization. A large fraction of magnetic materials has a larger number of electrons whose spins are orientated parallel to the magnetic axis (N↑). Usually, the difference between the larger number of electrons whose spin orientation is parallel to the magnetic axis and the smaller number of electrons whose spin is orientated otherwise (N↓) is rather low. For example, in Ni this difference is 15–20%. However, there are some materials, termed half-metallic ferromagnets, whose electron spins are 100% polarized. These materials include chromium oxide, iron oxide and manganites of the type $A_{1-x}B_xMnO_3$ (where A is a rare earth, i.e., La, Nd, et cetera, and B is a divalent metal, i.e., Ca, Sr, Pb, et cetera).

The magnetic order of manganites can be described as follows: the manganese atoms, which can have both 3+ and 4+ valence, have spins S=2 and S=3/2, respectively. Below the Curie temperature (which varies between approximately 300 and 400 K in these materials), these magnetic moments arrange themselves in a parallel configuration due to the electron exchanges between Mn(3+) and Mn(4+). Due to a strong Hund energy, the manganese sites accept only electrons whose spins are orientated like their own magnetic moment. Accordingly, delocalization affects only one half of all the electrons, i.e., those having spin parallel to the magnetization axis of the Mn ions; those with an antiparallel spin remain localized. As a result, 100% polarization of the spins of charge carriers (the delocalized electrons) is produced.

When two ferromagnetic electrodes with polarized spins come into direct or tunnelling electric contact, the total electric resistance depends on the angle of misorientation of their spins: for parallel spins, resistance is lowest; for antiparallel spins, resistance is highest. This is described in qualitative terms by the deGennes formula for the electron transfer probability $T_{12}$ [6]:

$$T_{12}=b_{12}\cos(\Theta_{12}/2)+\text{const}, \tag{1}$$

where 1 and 2 correspond to the two ferromagnetic electrodes, $b_{12}$ is a tunnelling constant, and $\Theta_{12}$ is the angle between the magnetic axes of 1 and 2. If the external magnetic field is zero, the angle $\Theta_{12}$ can have any value between 0 and 180°. By introducing the magnetic field, both ferromagnetic electrodes assume the same oriention, the angle $\Theta_{12}=0$, and the value of $T_{12}$ reaches its maximum (lowest resistance). This is the cause of negative magnetoresistance. Owing to very high negative magnetoresistance values (up to six orders of magnitude), manganites are known as Colossal Magnetoresistance (CMR) materials.

In recent times, the fact has been clarified that the value of magnetoresistance in CMRs is truly high (up to 6 orders of magnitude) only for electric devices of the tunnelling or point-contact type. Individual crystals instead exhibit a magnetoresistance of 2–3% [7]. Accordingly, the only magnetoresistance devices that have an application value are tunnelling or point-contact ones.

SUMMARY OF THE INVENTION

The aim of the present invention is to provide a method and a device for injecting and transporting spin-polarized charge carriers by using, as medium for charge carrier transport, a low-cost material which can be deposited with low-cost methods which can be performed easily and in a reversible manner so that it can be easily replaced with another material if necessary.

An object of the present invention is to provide new active elements for magnetoelectronics, thereby the resistance of the devices based on such elements is sensitive to the spin polarization of the carriers passing across said elements.

Another object is to provide light-emitting diodes (LEDs) with improved efficiency.

Conventional LED light-emitting diodes consist of two electrodes (electron injectors and hole injectors) between which a layer of electroluminescent material is placed. During the flow of current between the two electrodes, excitons, i.e., highly bound electron-hole pairs, are injected into electroluminescent material. The singlet states generate a radioactive emission, usually in the visible spectrum, while the triplet states generate an emission, which causes delayed phosphorescence [8]. Accordingly, the optical emission of LEDs is generally based on transitions between singlet states.

In the two electrodes used in conventional LEDs, all spin polarizations are present (SP=0), and the statistics of electron spins inside the layer of organic semiconductor regulates the filling of the exciton states as follows [9]:

| 1. Singlet | (S=0)  | ->e↑p↓       | ->25% |
|------------|--------|--------------|-------|
| 2. Triplet | (S=1)  | ->e↑p↑       | ->25% |
|            | (S=0)  | ->e↑p↓ + e↓p↑ | ->25% |
|            | (S=-1) | ->e↓p↓       | ->25% |

Accordingly, spin statistics sets a filling limit of 25% for the S=0 levels, contributing, together with several other processes, to a reduction in the efficiency of LEDs. If one electrode is a half-metallic ferromagnet, all the charges injected by said electrode have the same spin, for example −e↑. If one observes the above spin statistics, it is evident that only the combinations that do not have electrons with e↓ electron spin are now possible. Accordingly, the levels e↑p↓ and e↑p↑ are filled, and this changes from 25% to 50% the filling of the singlet layers. The additional use of a second spin-polarized electrode as holes injector leads to a 100% S=0 level filling, with a 75% improvement in the efficiency of the LED.

The statistical considerations presented above are based on the arguments discussed in classical manuals of quantum mechanics and therefore experimental tests are not necessary. On the other hand, to realize such a selective filling of a chosen exciton level (singlet in our case) it is important the charge carriers to not lose their spin orientation after escaping out of the electrode. What the inventors of the present invention have found is that the electrons (holes), once injected into the organic material, do not lose memory of the spin orientation that they had in the electrode.

Accordingly, another object of the present invention is to provide a method and a device which allow an increased filling of the singlet exciton states, which are optically active in the electroluminescent material.

The above-mentioned objects and others which will become apparent from the present description are achieved with a method according to the invention for transferring charge carriers, comprising the steps of:

a) injection of spin-polarized charge carriers in an organic material and b) transport of said spin-polarized charge carriers through said organic material.

The organic material is an organic material capable of carrying an electric current, preferably an organic material chosen from the group constituted by polythiophenes and metal-phthalocyanines.

A preferred example is constituted by the organic materials sexithiophene and zinc-phthalocyanine.

The organic material can be in the form of a thin layer having a thickness suitable to ensure the electrical continuity of the material.

The injection of step a) is preferably performed by means of the flow of electric current between two electrodes through a layer of organic material.

The two electrodes are made of materials having substantially 100% spin polarization of the charge carriers and are termed spin-polarized electrodes.

Preferably, the two electrodes are constituted by ferromagnetic manganites having the formula $A_{1-x}B_xMnO_3$.

A preferred example is constituted by electrodes made of $La_{0.7}Sr_{0.3}MnO_3$.

The transfer of charge carriers of step b) can be performed by applying an electric field to said organic material, particularly an electric field $E \geq 10^4$–$10^5$ V/cm.

DESCRIPTION OF THE PREFERRED EMBODIMENTS

Figure 1:
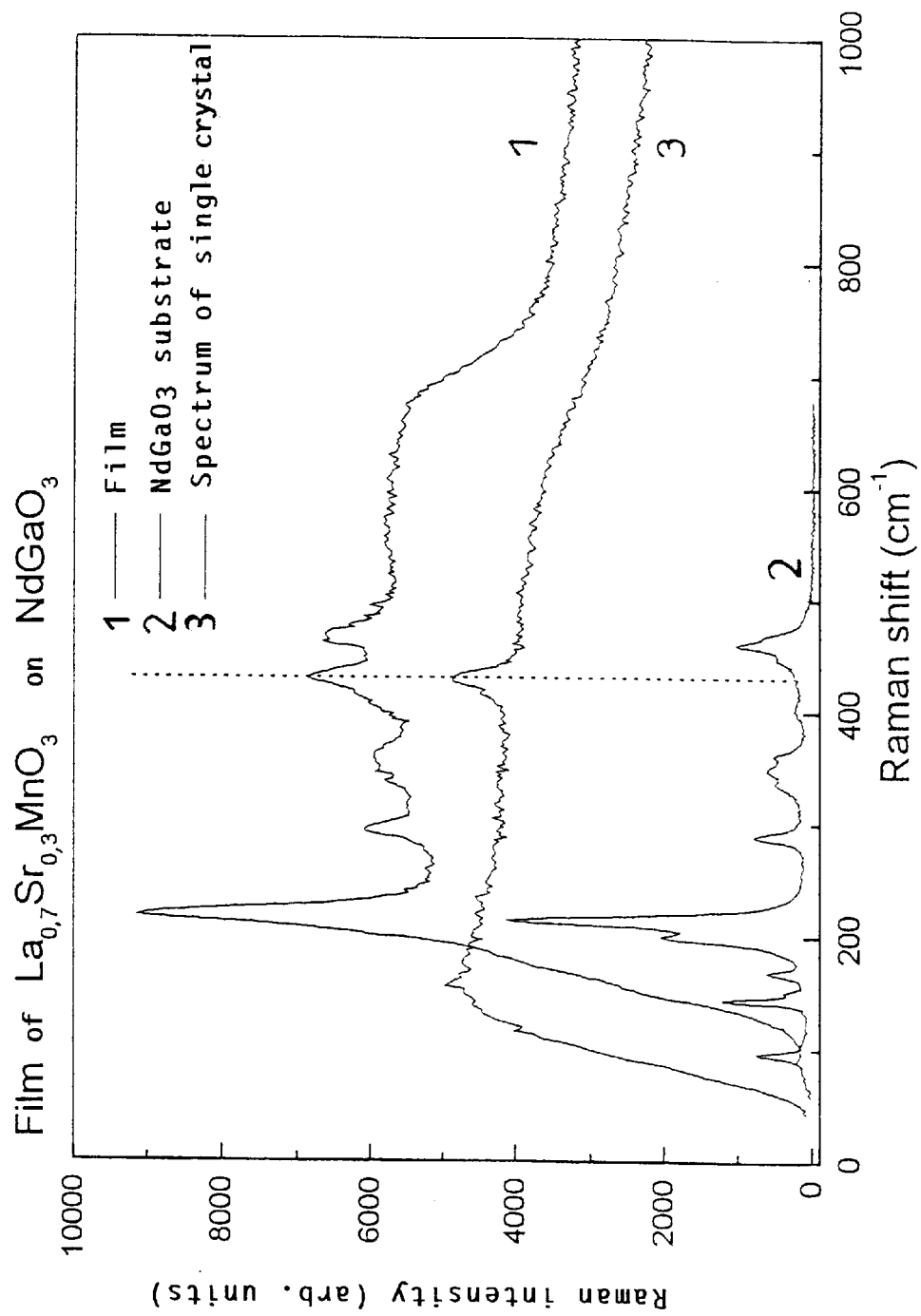
FIG. 1 shows a micro-Raman spectrum of a film on neodymium gallate.

An embodiment of the present invention relates to a method for inducing magnetoresistance in an organic material, which comprises the steps of:

a) injection of spin-polarized charge carriers in an organic material from a spin-polarized electrode, b) transport of said spin-polarized charge carriers through said organic material, between said spin-polarized electrode and a second spin-polarized electrode with application of an external magnetic field.

Another aspect of the present invention relates to a device for transferring charge carriers, comprising:

a) means for injecting spin-polarized charge carriers, and b) a medium suitable for the transport of spin-polarized charge carriers, said medium suitable for the transport of spin-polarized charge carriers comprising an organic material.

The organic material is an organic material capable of carrying electric current.

Preferably, the organic material is chosen from the group constituted by polythiophenes and metal-phthalocyanines. A preferred example is constituted by sexithiophene and zinc-phthalocyanine.

The organic material can be in the form of a thin layer, with a thickness suitable to ensure the electrical continuity of the material.

The means for injecting the spin-polarized charge carriers are preferably made of a material with 100% spin polarization of the charge carriers, more preferably ferromagnetic manganites having the formula $A_{1-x}B_xMnO_3$. The injection means are even more preferably made of $La_{0.7}Sr_{0.3}MnO_3$.

In one embodiment, the device according to the invention furthermore comprises means for applying an electric field to said material suitable to transport charge carriers.

In another embodiment, the device according to the present invention comprises an organic material which is an electroluminescent material, means for injecting spin-polarized charge carriers which are constituted by a first spin-polarized electrode and a second spin-polarized electrode, the first electrode being an electrode for injecting spin-polarized electrons and the second electrode being an electrode for injecting spin-polarized holes, the device being suitable for use as light-emitting diode.

In another embodiment, the invention relates to a device for inducing magnetoresistance in an organic material, comprising:
a) means for injecting spin-polarized charge carriers, comprising a first spin-polarized electrode and a second spin-polarized electrode, and
b) a medium suitable for the transport of spin-polarized charge carriers, the medium for the transport of spin-polarized charge carriers comprising the organic material interposed between said first and second spin-polarized electrodes, and
c) means for applying an external magnetic field.

Preferably, the devices according to the present invention comprise means for injecting spin-polarized charge carriers constituted by two electrodes which are in mutual tunnelling contact through the organic material, the magnetic polarization of the first and second electrodes can be changed separately by applying local magnetic fields, preferably stronger than 3000 Oe, and the device is suitable for use as memory element. Furthermore, the device according to the present invention can comprise a cathode which emits spin-polarized electrons, said cathode being made of materials having substantially 100% spin polarization of the charge carriers, and being covered by a protective layer formed by said organic material.

The inventors of the present invention have found that the charge carriers, once injected into an organic material, do not lose memory of the spin state that they had in the electrode. This fact leads to a change in the exciton state filling statistics. In the case of injection of charges having the same spin (i.e., spin-polarized charges), for example e↑, as regards the above cited spin statistics, only the combinations in which there are no electrons with e↓ electron spin remain possible. In this case, only the levels e↑p↓ and e↑p↑ are filled; therefore, statistically, the filling of the singlet states changes from 25% to 50%. Likewise, by using an injection of holes which also are spin-polarized (with the same spin), the S=0 singlet state filling statistics changes to 100%, i.e., yielding a 75% increase in the efficiency of the light-emitting device.

In order to examine the possibility to perform spin-polarized injection in a layer of organic material and to perform spin-polarized coherent transport through said organic material, the inventors of the present invention used devices, according to the invention, based on spin-polarized materials and various organic materials.

$La_{0.7}Sr_{0.3}MnO_3$, which is a typical representative of the $A_{1-x}B_xMnO_3$ system, was used as spin-polarized material.

Thin films of $La_{0.7}Sr_{0.3}MnO_3$ were deposited with the Channel-Spark ablation method on substrates of neodymium gallate or strontium titanate. The thickness of the film used varies between 50 and 200 nm, allowing to provide in the film a highly ordered crystallographic structure and electrical and magnetic properties similar to those of single crystals.

The micro-Raman spectrum of a film on neodymium gallate is shown in FIG. 1, which shows the micro-Raman spectra of a typical ferromagnetic film, of the single crystal of $La_{0.7}Sr_{0.3}MnO_3$, and of the neodymium gallate substrate.

It is noted that the quality of the film is very high, showing the complete absence of spurious phases (only the peaks of the substrate and those of the $La_{0.7}Sr_{0.3}MnO_3$ are present).

Figure 2:
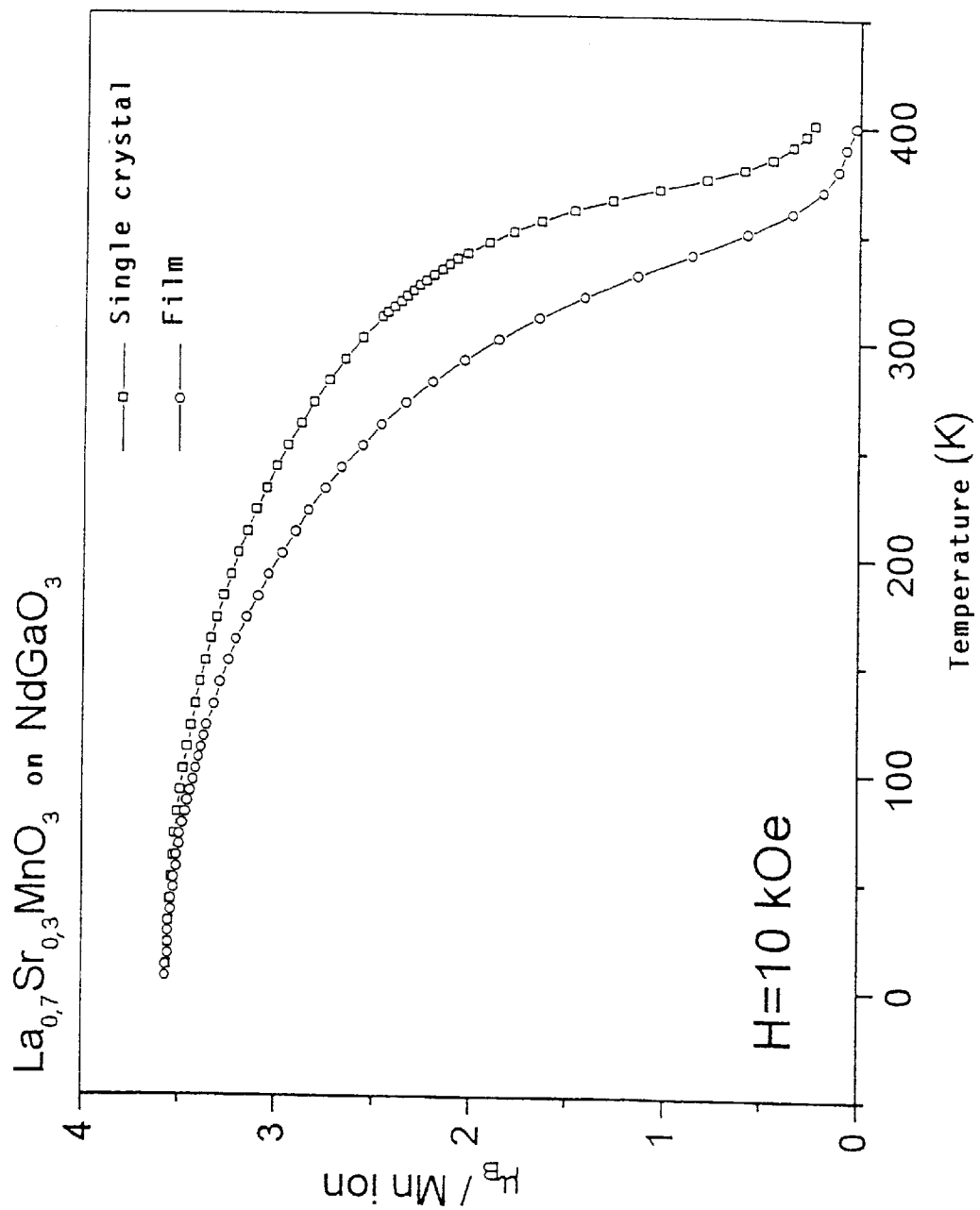
FIG. 2 shows plots of magnetic moment over temperature for a typical ferromagnetic film and for the single crystal of $La_{0.7}Sr_{0.3}MnO_3$.

The magnetic measurements show a Curie temperature which abundantly exceeds the ambient temperature, i.e., $T_c=375K$, as shown by FIG. 2 (which plots magnetic moment over temperature for a typical ferromagnetic film and for the single crystal of $La_{0.7}Sr_{0.3}MnO_3$). This allows to work with the films in the ferromagnetic state at ambient temperature.

Figure 3:
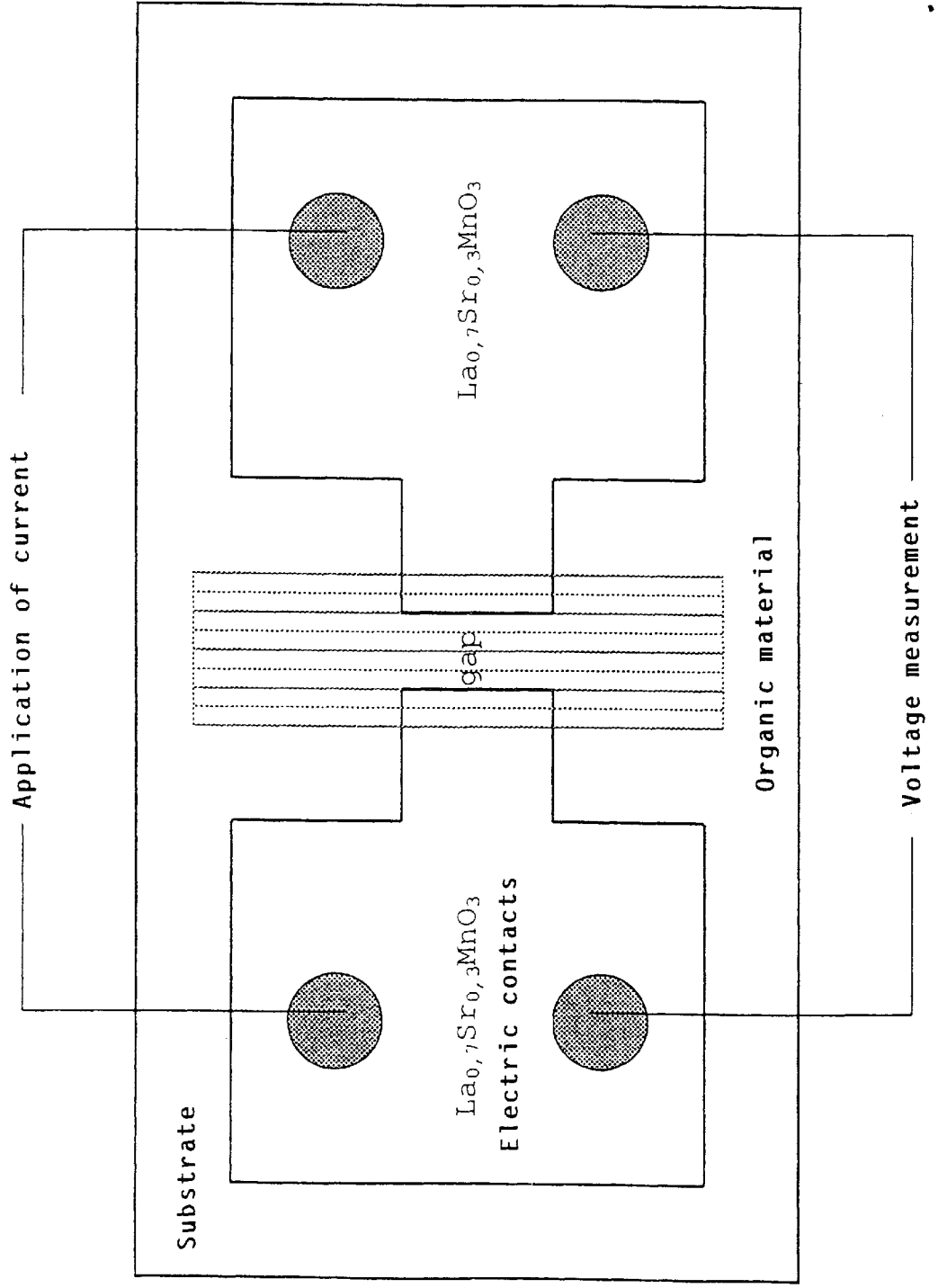
FIG. 3 illustrates two spin-polarized electrodes separated by a nanogap prepared by applying a nanoscopic technique.

After the deposition of the $La_{0.7}Sr_{0.3}MnO_3$ films, nanoscopic devices were created as shown in FIG. 3, which illustrates two spin-polarized electrodes separated by a nanogap prepared by applying a nanoscopic technique.

The gaps vary between 70 and 500 nm for the various films used.

The measurements of resistance across the gap yielded infinite resistance. Accordingly, the CMR electrodes are completely separated.

The consecutive step for producing the device was the provision of an organic bridge between the two electrodes.

Organic films were deposited by means of the thermal vaporization method through the masks in order to create a stripe, which covers the gap and leaves the two electrodes open (FIG. 3).

The organic materials used are sexithiophene and zinc-phthalocyanine. Since both are nonmagnetic materials, in normal conditions they can have no negative magnetoresistance, i.e., a decrease in resistance due to the alignment of the localized magnetic moments. Repeated measurements conducted by us both on the sexithiophene films and on the zinc-phthalocyanine films have confirmed the total absence of negative magnetoresistance when nonmagnetic electrodes (gold, silver paste) are used. In organic materials of this type, a weak positive magnetoresistance can be measured [10], but only in very intense magnetic fields (over 60–80 kOe).

Tunnelling-type experiments were conducted in order to examine the possibility of injecting spin-polarized charge carriers from the spin-polarized ferromagnetic electrodes.

The transfer of the spins through the material was examined by inserting the organic material between the two spin-polarized electrodes. One of the ferromagnetic electrodes emitted spin-polarized charges, and the other one acted as detector, sensitive to the angle $\Theta$ of the incoming spins. In order to reveal the presence or absence of an interference of the organic material with the orientation of the electron spins, the influence of the variation of the magnetic field on the resistance of the device was studied. Negative magnetoresistance of the ferromagnet-organic material-ferromagnet device would demonstrate that the organic material does not change, or only partially changes, the orientation of the spins of the charge carriers that pass through it. Negative magnetoresistance is caused by the alignment of the spins in the two ferromagnetic electrodes under the action of the magnetic field. If instead the resistance of said device would show no dependency on the magnetic field except for the possible intrinsic magnetoresistance of the organic material (which is zero in the case of the experiments conducted), the conclusion is that the spins lose their initial orientation inside the organic material or at the ferromagnet-organic interface.

Figure 4:
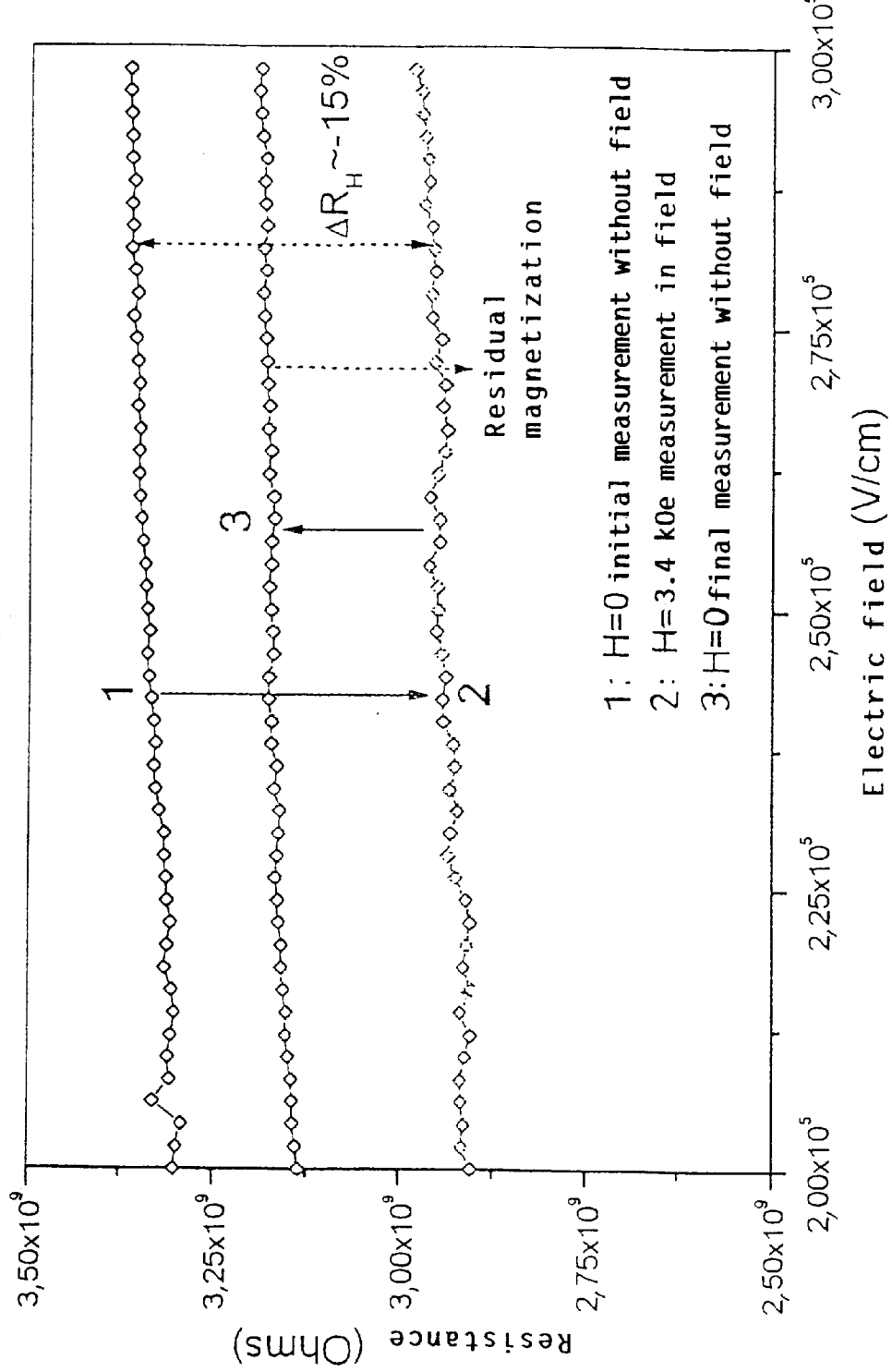
FIG. 4 shows the magnetoresistance measured on a tunnelling device of the (ferromagnet)-(organicmaterial)-(ferromagnet) type.

FIG. 4 shows the magnetoresistance measured on a tunnelling device of the (ferromagnet)-(organic material)-(ferromagnet) type, particularly of the $La_{0.7}Sr_{0.3}MnO_3$—sexithiophene—$La_{0.7}Sr_{0.3}MnO_3$ type. The thickness of the ferromagnetic material is 100 nm, the gap between the electrodes is 100 nm and the thickness of the organic film is 125 nm. The resistance of the device across the organic layer was measured by using a picoammeter at various voltages. The measurements were conducted at ambient temperature and in a normal atmosphere (without vacuum).

Resistance changes from approximately 3.35 G$\Omega$ with zero magnetic field (black curve) to 2.95 G$\Omega$ with the insertion of 3.4 kOe at right angles to the surface (curve 2), yielding a magnetoresistance of ~15%. Immediately after shutting down the magnetic field (t<1 min), the resistance reaches an intermediate state (curve 3), which is due to a residual alignment of the electrodes which is higher than the initial one. After 10–15 minutes, the resistance returns to the initial values (curve 1). The measurements were repeated several times. After ending a set of measurements, the organic material was dissolved and deposited again. By repeating this procedure four times, it was found that the results were reproducible for each nanogap. The maximum value of 15% (approximately 5%/kOe) for magnetoresistance observed in devices with sexithiophene is comparable with the values that occur in commercial devices used in magnetoelectronics [1]. This value could be increased further if magnetoresistance were measured as difference between antiparallel alignment and parallel alignment. The magnetoresistance value decreases with the width of the cap and is 10% for 200-nm gaps and 0% for 300-nm gaps. This last fact confirms once again the absence of intrinsic negative magnetoresistance in sexithiophene, since it is a direct measurement on the device being considered. The coherence length is therefore estimated at 200–300 nm at ambient temperature.

The change of the polarization of the spins during transfer through a certain material can occur essentially for two reasons: due to scattering on the magnetic centers or due to spin-orbital interaction. Sexithiophene contains no magnetic atoms and the spin-orbital interaction in this type of material is very low due to the absence of heavy atoms. The polarized (coherent) transfer of the spins observed with the experiments thus becomes possible.

The same experiment was repeated by using as organic material zinc-phthalocyanine, which is very different from sexithiophene owing to the presence of a metallic atom in the molecule.

Figure 5:
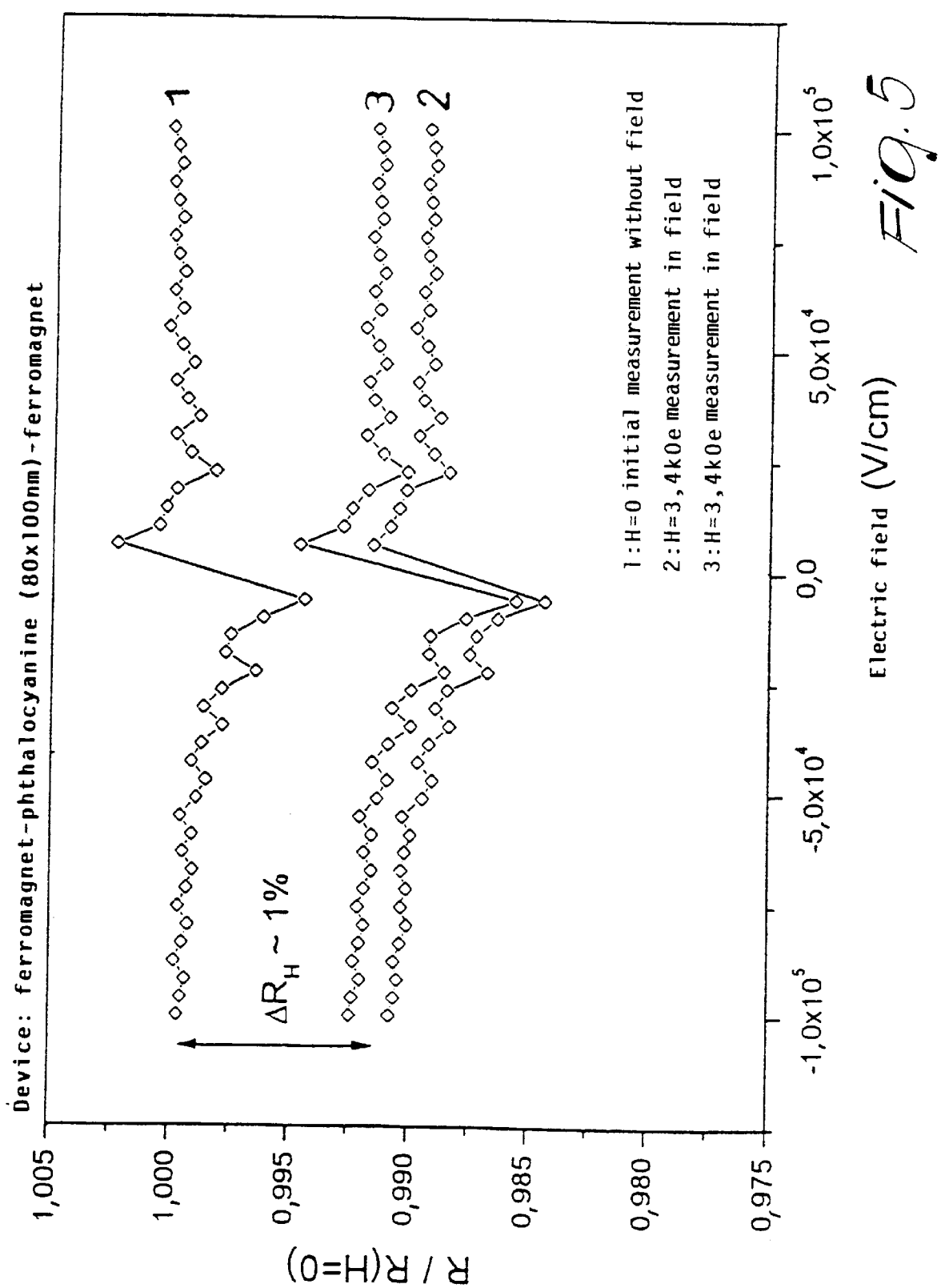
FIG. 5 shows the measurements of resistance with and without magnetic field of a device similar to the one shown in FIG. 4.

The presence of the metallic atom must increase the effect of the spin-orbital interaction, causing a reduction, if not the elimination, of spin-polarized transfer. FIG. 5 shows the measurements of resistance with and without magnetic field of a device similar to the one shown in FIG. 4. The organic material is a film of zinc-phthalocyanine 100 nm thick; the ferromagnetic material is the same material ($La_{0.7}Sr_{0.3}MnO_3$), and the gap that separates the electrodes is approximately 80 nm. The resistance was normalized with respect to the resistance of the device in the absence of the magnetic field. The magnetic fields applied were both parallel to the substrate (+) and antiparallel thereto (-), and 1% magnetoresistance was observed. This experiment, too, was repeated several times, and high reproducibility of the results was observed. Accordingly, spin-polarized transfer was confirmed for zinc-phthalocyanine also.

Generalizing the results obtained on two organic materials having very different electrical properties, one can conclude that the possibility of spin-polarized injection and the transfer of charges with substantially polarized spins through thin organic layers (up to 200–300 nm) without magnetic moment has been demonstrated for the first time. It is very important to stress that these effects were observed at ambient temperature and in a normal atmosphere, thus paving the way for several applications. The electric fields used to transport the charge carriers across the tunnels were $10^4$–$10^5$ V/cm for both organic materials.

In any case, it is important to note that the organic materials used, despite being very different from each other, have no intrinsic magnetic moment and therefore are weak paramagnets. At present, the effect of any magnetic moment of the organic layer on the spin-polarized transfer is not known. On the other hand, at ambient temperature, almost all the organic materials are paramagnetic; ferromagnetism in organic materials usually occurs at very low temperatures (<50 K). Accordingly, in normal conditions the spin-polarized transfer effect must be common for most organic conductors. It should be noted that organic materials (evidently) oppose a certain "magnetic resistance" to spin-polarized transfer, like any ordinary electrical conductor opposes a resistance R to the transfer of electric charges. This is also evident from the difference between sexithiophene and zinc-phthalocyanine. Accordingly, it has been demonstrated that organic materials can be conductors of the polarization of the spins of charge carriers, but there is no evidence that they can be spin polarization superconductors.

The present invention, based on the possibility to substantially control spin polarization (SP) of the charge carriers injected in semiconductor devices (inorganic and organic ones) allows to control a hitherto uncontrolled parameter which has a primary importance in electrooptical and electromagnetic processes.

Furthermore, the present invention allows creating new kinds of devices, combining CMR materials with organic materials and inserting as active material a material which is optically highly nonlinear and thus providing a further boost to magnetoelectronics.

Furthermore, the present invention provides a process for injecting polarized spins in organic semiconductors and for spin-polarized transfer across organic semiconductors.

The experiments conducted used devices which included two spin-polarized electrodes of material separated by a narrow nanogap and connected, across said gap, by a bridge of organic material. The spin-polarized charge carriers were injected from electrodes into the organic material and crossed it, maintaining their polarization. The useful signal consisted of the magnetoresistance measured across the device.

The invention illustratively disclosed suitably may be practiced in the absence of any element and/or step which is not specifically disclosed herein.

The disclosure of Italian Patent Application No. MI2000A000603 from which the present invention claims priority is herein incorporated by reference.

REFERENCES

1. G. A. Prinz, Science, vol. 282, 1660 (1998)
2. M. N. Baibich, J. M. Broto, A. Fert, F. Nguyen Van Dau, F. Petroff, P. Etienne, G. Greuzet, A. Friederich, J. Chazelas, Phys. Rev. Lett., Vol. 61, 2472(1988)
3. S. Jin, T. H. Tiefel, M. McCormack, R. A. Fastnacht, R. Ramesh, L. H. Chen, Science, vol. 264, 413 (1994)

4. W. Nabhan, Y. Suzuki, Appl. Phys. A, vol. 66, S101 (1998); M. Oesterech, J. Hübner, D. Hägele, P. J. Klar, W. Heimbrodt, W. W. Rühle, D. Ashenford, B. Lunn, Appl. Phys. Lett., vol. 74, 1251 (1999)

5. A. Filipe, Materials Research Society Symposium Proceedings, vol. 475, 75 (1997); H. Batelaan, A. S. Green, B. A. Hitt, T. J. Gay, Phys. Rev. Lett., vol. 82, 4216 (1999)

6. P.-G. deGennes, Phys. Rev., v. 118, 141 (1960)

7. H. Y. Hwang, S.-W. Cheong, N. P. Ong, B. Batlogg, Phys. Rev. Lett., vol. 77, 2041 (1996)

8. J. Kalinowski, NATO ASI SERIES 3 HIGH TECHNOLOGY, 1997, vol. 24, pages 167–206; R. H. Friend, R. W. Gymer, A. B. Holmes, J. H. Burroughes, R. N. Marks, C. Taliani, D. D. C. Bradley, D. A. Dos Santos, J. L. Brédas, M. Lögdlund, and W. R. Salaneck, Nature 397, 121 (1999)

9. F. Cacialli, Phil. Trans. R. Soc. Lond. A, vol. 358, 173 (2000); A. L. Burin, M. A. Ratner, J. Chem. Phys. vol. 109, 6092 (1998)

10. D. Delabouglise, D. Berner, J.-P. Travers, Synthetic Metals, vol. 101, 377 (1999)

11. U.S. Pat. No. 5,874,749: Polarized optical emission due to decay or recombination of spin-polarized injected carriers 12. U.S. Pat. No. 4,823,177: Method and device for magnetizing thin films by the use of injected spin-polarized current 13. U.S. Pat. No. 5,872,368: Method of controlling a superconductor 14. U.S. Pat. No. 5,838,020: Method and apparatus for storing data using spin-polarized electrons 15. U.S. Pat. No. 5,723,978: Photo-inducible magnetic exchange coupling device.

What is claimed is:

1. A method for transferring spin-polarized charge carriers, comprising the steps of:
   a) injecting spin-polarized charge carriers in an organic material; and
   b) transporting said spin-polarized charge carriers through said organic material.

2. The method according to claim 1, wherein said organic material is an organic material capable of carrying electric current.

3. The method according to claim 2, wherein said organic material is chosen from the group consisting of polythiophenes and metal-phthalocyanines.

4. The method according to claim 2, wherein said material is in the form of a thin layer, with a thickness suitable to ensure the electrical continuity of said material.

5. The method according to claim 1, wherein the injection of step a) is performed by means of the flow of electric current between two electrodes through a layer of said organic material.

6. The method according to claim 5, wherein said electrodes are made of materials having 100% charge carrier spin polarization.

7. The method according to claim 6, wherein said electrode are ferromagnetic manganites having the formula $A_{0.7}B_{0.3}MnO_3$, where A is a rare earth and B is a divalent metal.

8. The method according to claim 7, wherein said electrodes are made of $La_{0.7}Sr_{0.3}MnO_3$.

9. The method according to claim 1, wherein the transport of said charge carriers is provided by applying an electric field to said organic material, particularly an electric field $E \geq 10^4-10^5$ V/cm.

10. A method for inducing magnetoresistance in an organic material, comprising the steps of:
   a) injecting spin-polarized charge carriers in an organic material from a spin-polarized electrode; and
   b) transporting said spin-polarized charge carriers through said organic material between said spin-polarized electrode and a second spin-polarized electrode, with application of an external magnetic field.

11. A device for the spin-polarized transfer of charge carriers, comprising:
   a) a medium suitable for the transport of spin-polarized charge carriers, and
   b) means for injecting spin-polarized charge carriers in said medium suitable for the transport of spin-polarized charge carriers;
   said medium comprising an organic material suitable to transport the spin-polarized charge carriers.

12. The device according to claim 11, wherein the organic material is an organic material capable of carrying an electric current.

13. The device according to claim 11, wherein the organic material is chosen from the group consisting of polythiophenes and metal-phthalocyanines.

14. The device according to claim 11, wherein the material is in the form of a thin layer, with a thickness suitable to ensure the electrical continuity of said material.

15. The device according to claim 11, wherein said injection means are made of materials having 100% charge carrier spin polarization.

16. The device according to claim 15, wherein said injection means are made from ferromagnetic manganites having the formula $A_{0.7}B_{0.3}MnO_3$.

17. The device according to claim 16, wherein said injection means are made of $La_{0.7}Sr_{0.3}MnO_3$.

18. The device according to claim 11, further comprising means for applying an electric field to said material suitable to transport charge carriers.

19. The device according to claim 11, wherein said organic material is an electroluminescent material, said means for injecting spin-polarized charge carriers are a first spin-polarized electrode and a second spin-polarized electrode, said first electrode being an electrode for injecting spin-polarized electrons and said second electrode being an electrode for injecting spin-polarized holes, said device being suitable for use as a light-emitting diode.

20. The device according to claim 11 for inducing magnetoresistance in an organic material, comprising:
   a) means for injecting spin-polarized charge carriers, comprising a first spin-polarized electrode and a second spin-polarized electrode; and
   b) a medium suitable to transport spin-polarized charge carriers, said medium for transporting spin-polarized charge carriers comprising an organic material which is interposed between said first and second spin-polarized electrodes; and
   c) means for applying an external magnetic field.

21. The device according to claim 11, wherein said means for injecting spin-polarized charge carriers comprise two electrodes which are in tunnelling contact with each other through said organic material, and the magnetic polarization of said first and second electrodes can be changed separately by applying local magnetic fields, said device being suitable for use as a memory element.

22. The device according to claim 11, comprising a cathode for emitting spin-polarized electrons, said cathode being made of materials having 100% charge carrier spin polarization and being coated by a protective layer formed by said organic material.

* * * * *